United States Patent
Chen et al.

(10) Patent No.: US 12,402,547 B1
(45) Date of Patent: Aug. 26, 2025

(54) FLEXIBLE MEMORY SYSTEMS AND RELATED METHODS

(71) Applicant: Arizona Board of Regents, Flagstaff, AZ (US)

(72) Inventors: Ying-Chen Chen, Flagstaff, AZ (US); John Gibbs, Flagstaff, AZ (US)

(73) Assignee: Arizona Board of Regents acting for and on behalf Northern Arizona University, Flagstaff, AZ (US)

(*) Notice: Subject to any disclaimer, the term of this patent is extended or adjusted under 35 U.S.C. 154(b) by 424 days.

(21) Appl. No.: 18/166,323

(22) Filed: Feb. 8, 2023

Related U.S. Application Data

(60) Provisional application No. 63/267,711, filed on Feb. 8, 2022.

(51) Int. Cl.
*H10N 70/00* (2023.01)
*G11C 13/00* (2006.01)

(52) U.S. Cl.
CPC ....... *H10N 70/8833* (2023.02); *G11C 13/004* (2013.01); *H10N 70/026* (2023.02); *H10N 70/061* (2023.02); *H10N 70/841* (2023.02); *G11C 2013/0045* (2013.01)

(58) Field of Classification Search
CPC ............ H10N 70/8833; H10N 70/026; H10N 70/061; H10N 70/841; G11C 13/004; G11C 2013/0045
See application file for complete search history.

(56) References Cited

U.S. PATENT DOCUMENTS 9,349,951 B2 * 5/2016 Liu .................. H10B 63/80
9,520,550 B2 * 12/2016 Kim .................. G11C 11/1675

OTHER PUBLICATIONS

Jiang, et al., "A novel true random No. generator based on a stochastic diffusive memristor," Nature Communications, 8: 882, pp. 1-9. DOI: 10.1038/s41467-017-00869-x.

Chen, et al., "Built-in Nonlinear Characteristics of Low Power Operating One—Resistor Selector-less RRAM by Stacking Engineering," ECS Transactions, 80 (10) 923-931 (2017)10.1149/08010.0923ecst ©The Electrochemical Society.

Wang, et al., "Enhancing the Matrix Addressing of Flexible Sensory Arrays by a Highly Nonlinear Threshold Switch," Adv. Mater. 2018, 1802516, pp. 1-9. DOI: 10.1002/adma.201802516.

Vaziri, et al., "First Fire-free, Low-voltage (~1.2 V), and Low Off-current (~3 nA) SiOxTey Selectors," 2022 IEEE Symposium on VLSI Technology and Circuits (VLSI Technology and Circuits), IEEE, pp. 324-325. DOI: 10.1109/VLSITechnologyandCir46769.2022.9830395.

Korolev, et al., "Manipulation of resistive state of silicon oxide memristor by means of current limitation during electroforming," Superlattices and Microstructures, S0749-6036(18)31369-7, pp. 1-12. DOI 10.1016/j.spmi.2018.07.006.

Jeon, et al., "Low power Ti-doped NbO2-based selector device with high selectivity and low OFF current," Journal of Alloys and Compounds 884 (2021) 161041. pp. 1-8. https://doi.org/10.1016/j.jallcom.2021.161041.

* cited by examiner

*Primary Examiner* — Allison Bernstein
(74) *Attorney, Agent, or Firm* — IPTechLaw

(57) ABSTRACT

Implementations of a resistive random access memory may include a bottom electrode; a helical layer of hafnium oxide coupled to the bottom electrode; an isolation layer coupled to the helical layer; and a top electrode coupled to the isolation layer.

20 Claims, 20 Drawing Sheets

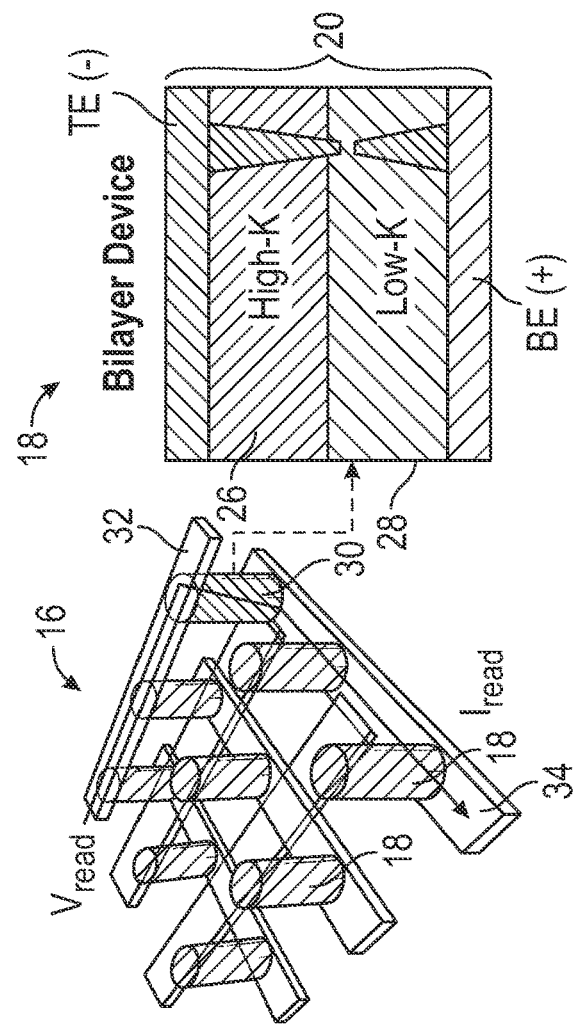
FIG. 3
FIG. 4
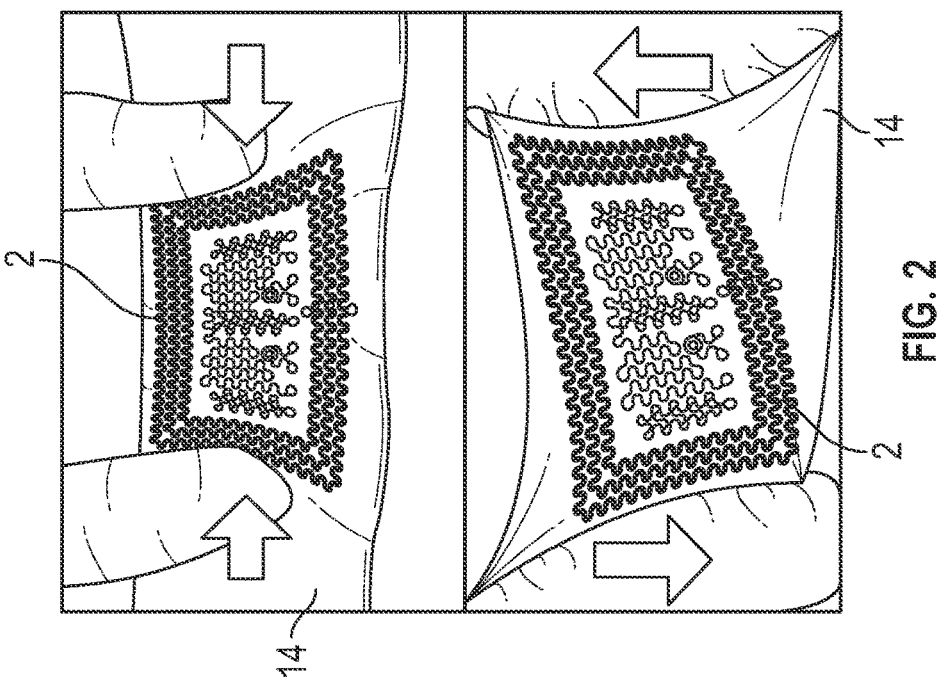
FIG. 2

FLEXIBLE MEMORY SYSTEMS AND RELATED METHODS

CROSS REFERENCE TO RELATED APPLICATIONS

This document claims the benefit of the filing date of U.S. Provisional Patent Application 63/267,711, entitled "Integrated Epidermal Self-Selective Neuromorphic Functionable (ESSNF) Electronic Systems" to Chen et al. which was filed on Feb. 8, 2022 (the '711 Provisional), the disclosure of which is hereby incorporated entirely herein by reference.

BACKGROUND

1. Technical Field

Aspects of this document relate generally to memory systems, such as memory systems used for electronic devices. More specific implementations involve memory systems for use with flexible electronic devices.

2. Background

Memory is used in electronic devices to store data for processing or to store data during processing. Some types of memory are volatile, meaning that data storage requires constant application of voltage. Other types of memory are nonvolatile, meaning that data storage continues even after voltage is no longer applied.

SUMMARY

Implementations of a resistive random access memory may include a bottom electrode; a helical layer of hafnium oxide coupled to the bottom electrode; an isolation layer coupled to the helical layer; and a top electrode coupled to the isolation layer.

Implementations of resistive random access memory may include one, all, or any of the following:

The bottom electrode and the top electrode may be each one of gold or platinum.

The isolation layer may be silicon dioxide.

The length of the helical layer may be between 50 nanometers and 200 nanometers.

The thickness of the isolation layer may be 5 nanometers.

The length of the helical layer may be between 60% to 80% of a total length of the memory.

The memory may be self-rectified.

Implementations of a resistive random access memory may include a bottom electrode; a helical layer of tungsten oxide coupled to the bottom electrode; an isolation layer coupled to the helical layer; and a top electrode coupled to the isolation layer.

Implementations of resistive random access memory may include, one, all, or any of the following:

The bottom electrode and the top electrode may be each one of gold or platinum.

The isolation layer may be silicon dioxide.

The length of the helical layer may be between 50 nanometers and 200 nanometers.

The thickness of the isolation layer may be 5 nanometers.

The selectivity of volatile switching of the memory may be recoverable and reconfigurable during operation.

The memory may be self-rectified.

Implementations of a method of forming a flexible memory system may include forming a film of resistive random access memory cells on a polymer transfer layer. Each resistive random access memory cell may include a bottom electrode; a helical layer of one of hafnium oxide or tungsten oxide coupled to the bottom electrode; an isolation layer coupled to the helical layer; and a top electrode coupled to the isolation layer. The method may include transferring the film of resistive random access memory cells to a thermal release tape; patterning the film of resistive random access memory cells; and transferring the patterned film of resistive random access memory cells to a flexible substrate.

Implementations of a method of forming a flexible memory system may include one, all, or any of the following:

Each cell of the film of resistive random access memory cells may include a selector.

Each cell of the film of resistive random access memory cells may be self-rectified.

The flexible substrate may be a biocompatible material.

Each cell of the film of resistive random access memory cells may include only two terminals.

Patterning the film of resistive random access memory cells or transferring the patterned film further may include applying a sacrificial polymer layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 2 is a view of a flexible electronic device in compression and in torsion;

FIG. 3 is a diagram of a bilayer memory device implementation;

FIG. 4 is a cross sectional diagram of a bilayer memory device implementation (1R);

DESCRIPTION

This disclosure, its aspects and implementations, are not limited to the specific components, assembly procedures or method elements disclosed herein. Many additional components, assembly procedures and/or method elements known in the art consistent with the intended flexible memory systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such flexible memory systems, and implementing components and methods, consistent with the intended operation and methods.

The various memory systems disclosed herein involve resistance random access memory (RRAM) and are designed to enable flexible electronic devices. The ability to use helical portions in each cell of the RRAM implementations disclosed herein allows the memory cell itself to be flexible and be incorporated into a flexible electronic device. Extensive disclosure regarding various RRAM and flexible electronic device systems and related neural network implementations like those disclosed in this document can be found in the '711 Provisional; Appendix A filed with the '711 Provisional; the paper to Chen et al, "Nano Helical-Shaped Dual-Functional Resistive Memory for Low-Power Crossbar Array Application," ACS App. Eng. Mater., V. 1, No. 1, p. 252-257 (November 2022) (Appendix A to this document filed herewith); and the paper to Chen et al, "Direct-Grown Helical-Shaped Tungsten-Oxide-Based Devices with Reconfigurable Selectivity for Memory Applications," J. Low Power Electron. Appl. V. 12, p. 55 (15 Oct. 2022) (Appendix B to this document filed herewith); the disclosures of each of which are hereby incorporated entirely herein by reference.

Figure 1:
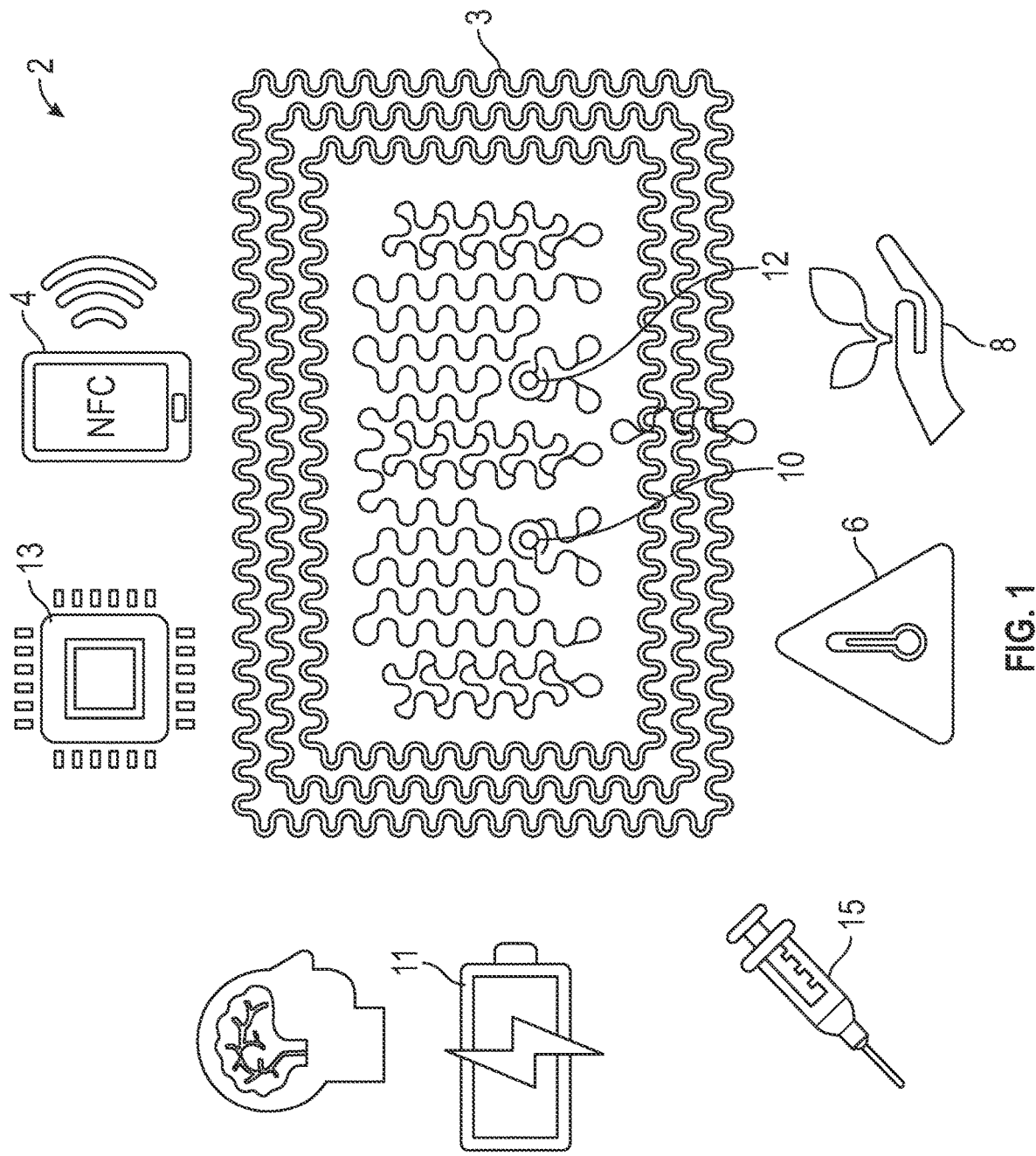
FIG. 1 is a diagram of components of a flexible electronic device and related components.
Figure 5:
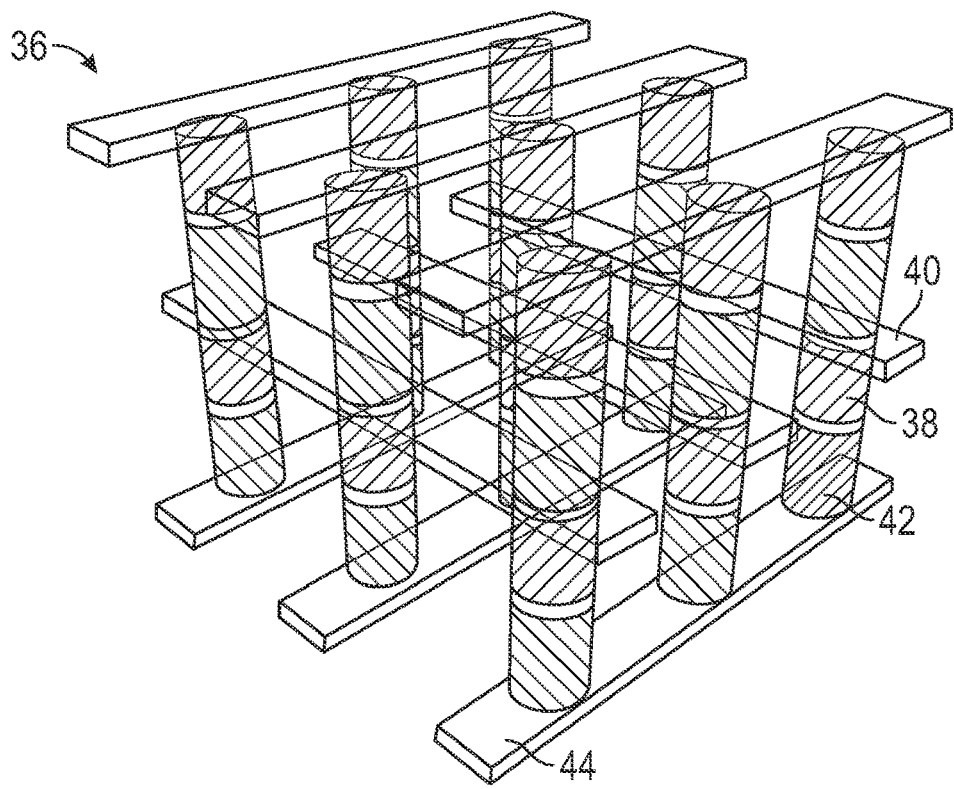
FIG. 5 is a diagram of a single selector single memory (1S-1R) device implementation.

The '711 Provisional and Appendix A to the '711 Provisional previously incorporated by reference provide significant background information regarding flexible electronic systems and underline the challenges associated with providing memory to such systems using conventional complementary metal oxide semiconductor (CMOS) architecture designs which rely on hard semiconductor substrates to form chips. Referring to FIG. 1, an implementation of a flexible electronic system 2 is illustrated that is in the form of a patch of flexible material on which a set of various flexibly electrically conductive traces 3 have been formed. As illustrated, the various traces can be integrated with various communications components like near field communication devices (NFC) 4, temperature sensor 6, environmental sensor 8, power source 11, processor 13, and delivery component 15 which may deliver a drug or other component to an individual's skin to which the flexible electronic device 2 is coupled. A wide variety of various electronic components and other devices could be coupled with or otherwise integrated into/with the flexible electronic device 2 in various implementations. FIG. 2 illustrates the flexible electronic device 2 being worn as a patch on a user's skin. In the upper figure, the device is shown in compression and in the lower figure the device is illustrated in torsion. FIG. 2 illustrates how the traces and other components on the flexible electronic device 2 need to be able to adjust/change shape during use of the device on a user's skin. The requirement that the components be flexible also extends to the memory components 10, 12 of the flexible electronic device 2, which may be RRAM devices like any disclosed in this document and the associated appendices.

Referring to FIG. 3, a diagram of a bilayer memory device implementation 16 is illustrated with a corresponding cross section of the length of one of the cells illustrated in FIG. 4. As illustrated, the bilayer memory device 16 includes a plurality of cells 18 that each have a length 20 illustrated by the cross sectional view in FIG. 4. As illustrated in FIG. 4, each of the cells 18 includes a top electrode 22, a bottom electrode 24, a layer of high dielectric constant material (greater than the dielectric constant of silicon dioxide) 26, and a layer of low dielectric constant material (at or below the dielectric constant of silicon dioxide) 28. The type of memory system illustrated by the bilayer memory device 16 is a memory only or 1R system that does not include any additional transistors (T) or selectors(S) as part of the structure due to the behavior of each of the cells 18. In various implementations, the high-K layer 26 takes the form of a helical layer that contains tungsten oxide or hafnium oxide and the low-K layer 28 may be air or a vacuum. The top electrode 22 material may be gold or platinum and the bottom electrode 24 material may be gold or platinum in various implementations.

FIG. 3 illustrates how a read voltage $V_{read}$ is applied to crossbar 32 coupled to the top electrode of cell 30 and a read current $I_{read}$ flows in the corresponding crossbar 34, indicating the state of the cell 30 (1 or 0). In this way, the state of every cell and can be read and set using the corresponding cross bars for each cell in this bilayer memory device implementation.

The principles disclosed herein, however, are not limited to bilayer memory devices. Referring to FIG. 1 a 1S1R crossbar array memory device is illustrated that contains one memory device (1R) and one selector device (1S). Here, the use of the selector 38 with the selected bit line crossbar 40 and word line cross bar 44 permits cell 42 to be selected and read/written to. The cell 42 may be any of the bilayer memory devices disclosed herein that include a helical layer.

Figure 6:
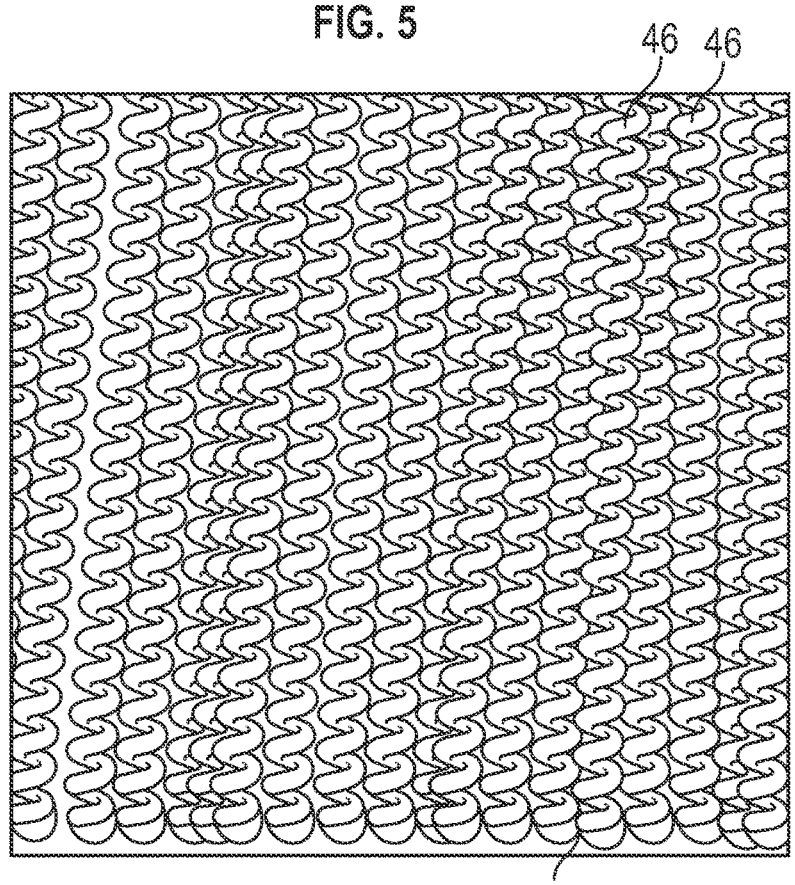
FIG. 6 is a side view of a plurality of helical layers of an implementation of a resistive random access memory.

FIG. 6 is a drawing of a scanning electron microscope image of a plurality of helical layers (nano helices) 46 coupled to a substrate 48 which may be formed using the various methods of formation which will be subsequently discussed hereafter. FIG. 6 illustrates how the layer of high-K material extends the length of the helical layer and forms a capacitive memory cell through the interaction of the high-K material and the low-K air or vacuum surrounding each of the helices.

Figure 7:
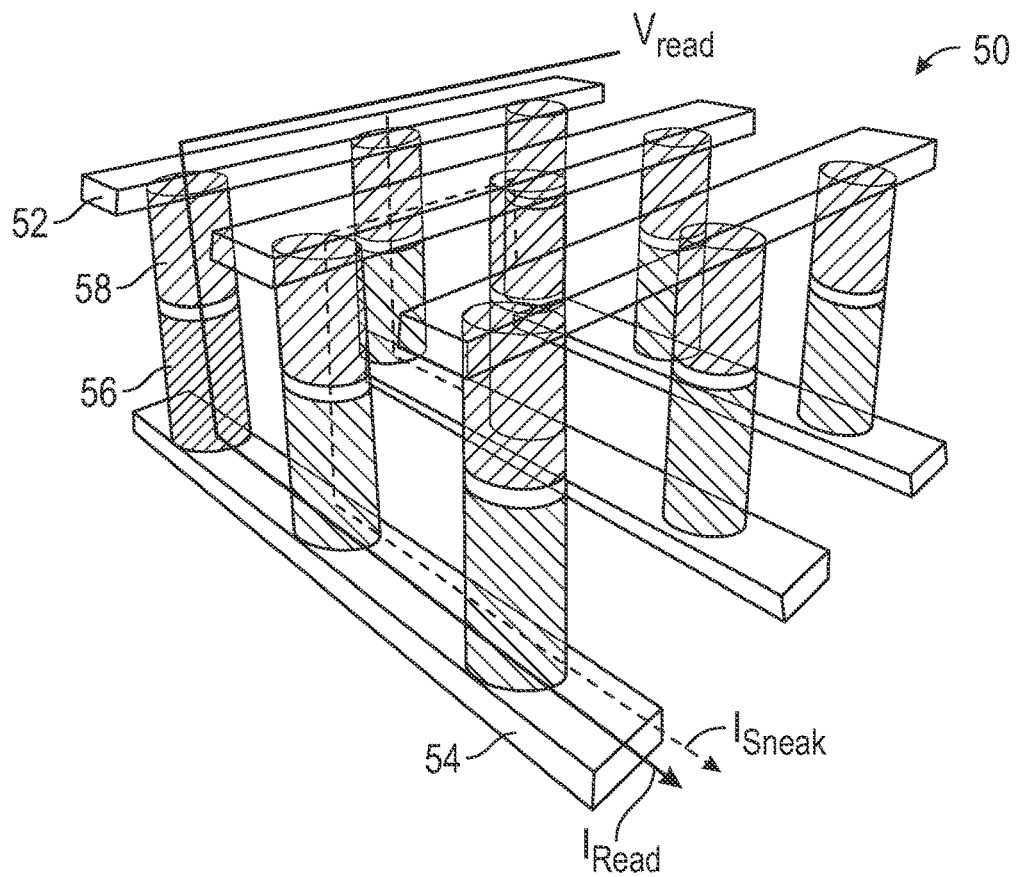
FIG. 7 is a diagram of a 1S-1R device implementation showing the direction of read current and sneak path current.

Referring to FIG. 7, a diagram of a 1S1R memory device 50 is illustrated showing how, when memory cell 56 is being read using crossbar 52 and cross bar 54 with read voltage $V_{read}$ and read current $I_{read}$, the voltage/current can induce a sneak path current $I_{Sneak}$ through various other members of the memory cell array (several paths are illustrated in dotted lines in FIG. 7). The sneak path current prevents the accurate reading of the actual state of the memory cell 56 because the states of the other cells in the path taken by the sneak path current influence the signal that is supposed to be being read/written to the memory cell 56. Where the memory cells 56 lack sufficient capacitance/resistance to prevent significant sneak path current from flowing, a selector 58 is used to ensure that sneak path current does not flow through any of the other cells, but the read current is only what is detected from the selected memory cell 56.

Figure 8:
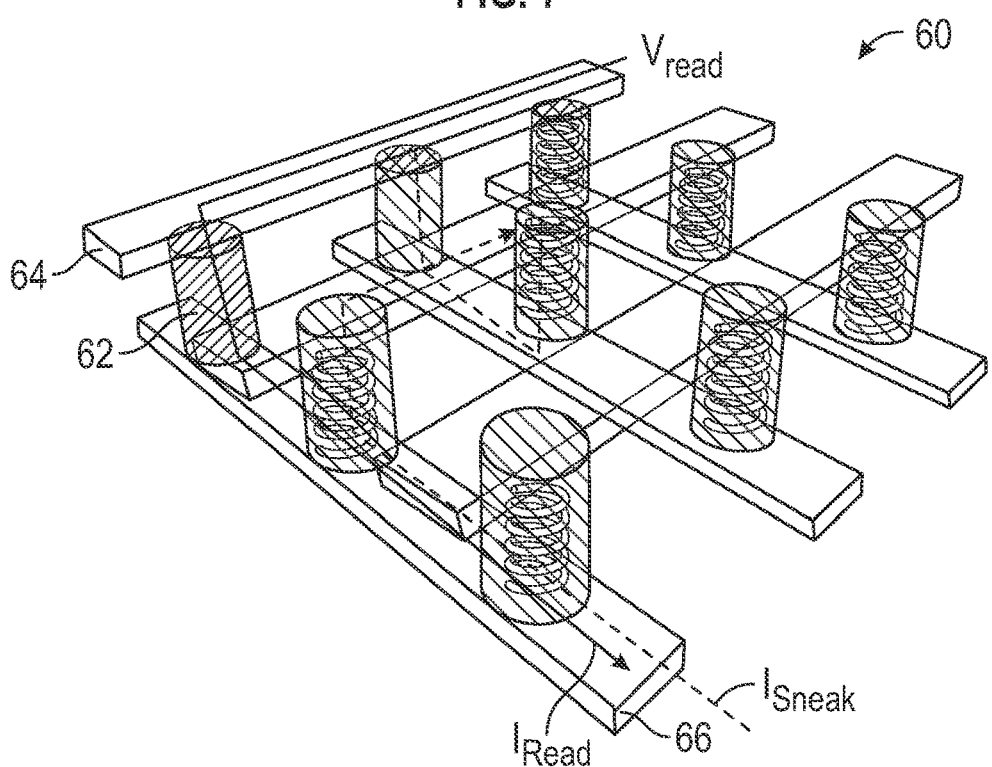
FIG. 8 is a diagram of a 1R device implementation showing the direction of read current and sneak path current.

Referring to FIG. 8, in various implementations of bilayer memory devices disclosed herein, the helical high-K layer of the cell allows for sufficient resistance/capacitance to prevent significant sneak path current from occurring without the use of selectors. FIG. 8 illustrates an array of bilayer memory devices 60 and the coil diagram in side each of the memory cells indicates that each has sufficient resistance to prevent sneak path current through them along the indicated paths in dotted lines when selected memory cell 62 is being read/written to using crossbars 64, 66. Because of this, no selector structure is needed, and each memory cell can then be directly read. This ability to not have to use transistors or selectors to read each specific memory cell in the array of the bilayer memory device (selector-less devices or self-rectifying devices) greatly simplifies the structure of the array and reduces the total number of components needed and the size of the array. Furthermore, the ability of use a simple bilayer for the memory array may further aid with the assembly of the memory array onto a flexible electronic substrate using the various method implementations disclosed herein. Also, the simpler structure requires fewer manufacturing steps and can therefore increase the possible yield of the manufacturing process accordingly.

Figure 9:
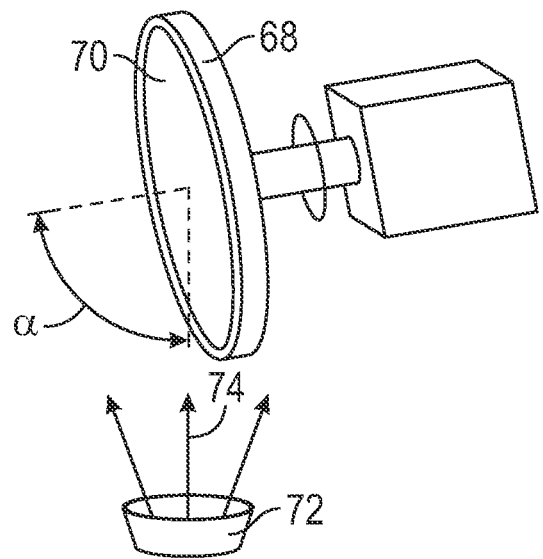
FIG. 9 is a diagram of an implementation of a wafer during a glancing angle deposition (GLAD) process.
Figure 10:
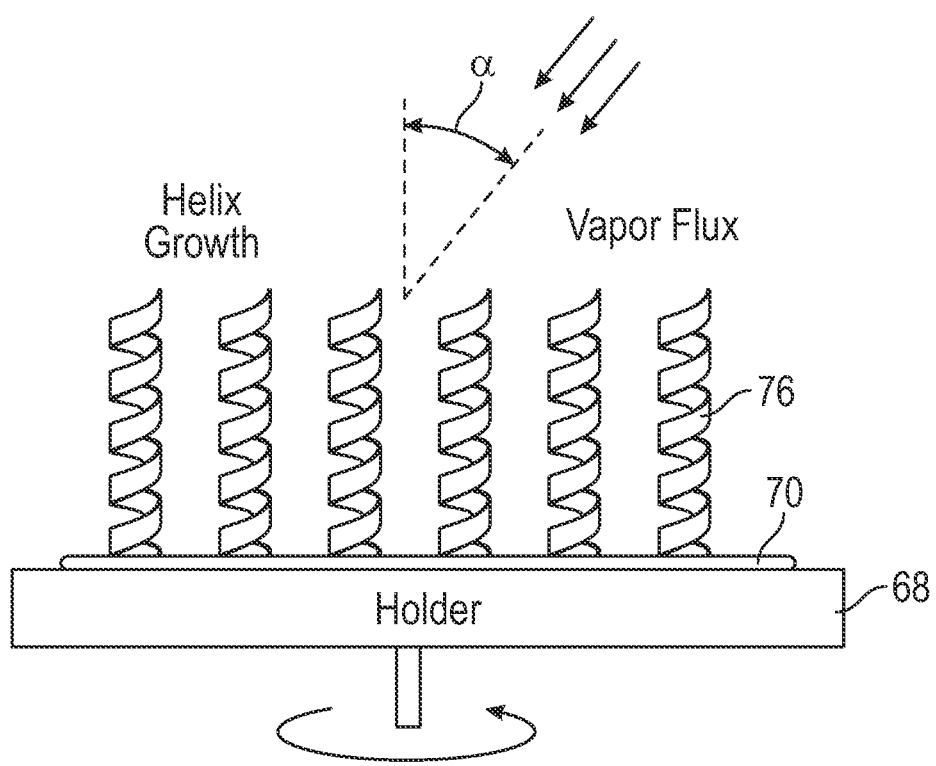
FIG. 10 is a diagram of a wafer holder during a GLAD process.
Figure 11:
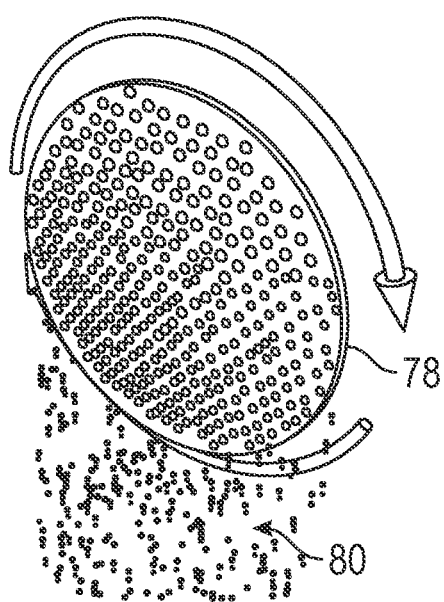
FIG. 11 is a diagram of a wafer during a GLAD process showing a direction of flow of a vapor plume toward the wafer.
Figure 12:
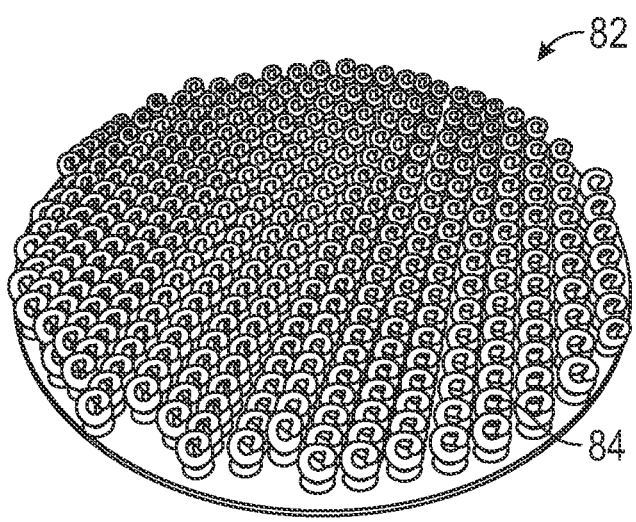
FIG. 12 is a perspective view of a wafer with a plurality of helical pillars formed thereon.

FIGS. 9-13 illustrate components of a glancing angle deposition (GLAD) process during formation of helical layers like those disclosed herein. FIG. 9 illustrates the position of a wafer holder 68 that holds wafer 70 thereto with any of a wide variety of techniques, including, by non-limiting example, double sided tape, vacuum, electrostatic forces, clips, or any other method of holding a wafer to a chuck. As illustrated, the wafer holder 68 can rotate and is placed in a vacuum chamber where an electronic beam or heat is being applied to material in crucible/holder 72 to create a plume of upwardly moving material 74 toward the wafer 70. As illustrated, the wafer holder 70 is able to hold the wafer at an angle α (polar angle Ø) with respect to the vapor plume as the wafer holder 70 rotates to achieve a shadowing effect needed to create helical deposition of the helical structures on the wafer 70. In particular implementations, the angle α may be 86 degrees. However, the angle α may be adjusted as desired to achieve the desired physical parameters of the helix grown. In various implementations, an azimuthal angle is also controlled which is defined as the change in polar angle over time measuring the wafer holder rotation with the average angular frequency given as $\omega=\Delta\varnothing/\Delta t$ with the angular frequency vector pointing parallel (or anti-parallel) to the surface normal. FIG. 10 illustrates in a not-to-scale drawing the wafer holder 68 and the resulting growing helices 76 forming by the vapor flux and the rotational speed of the holder rotation. FIG. 11 is a perspective view of a wafer holder and wafer 78 rotating while vapor plume 80 is traveling toward the wafer. FIG. 12 illustrates a wafer 82 with a plurality of helices 84 grown thereon ready for further processing.

Figure 13:
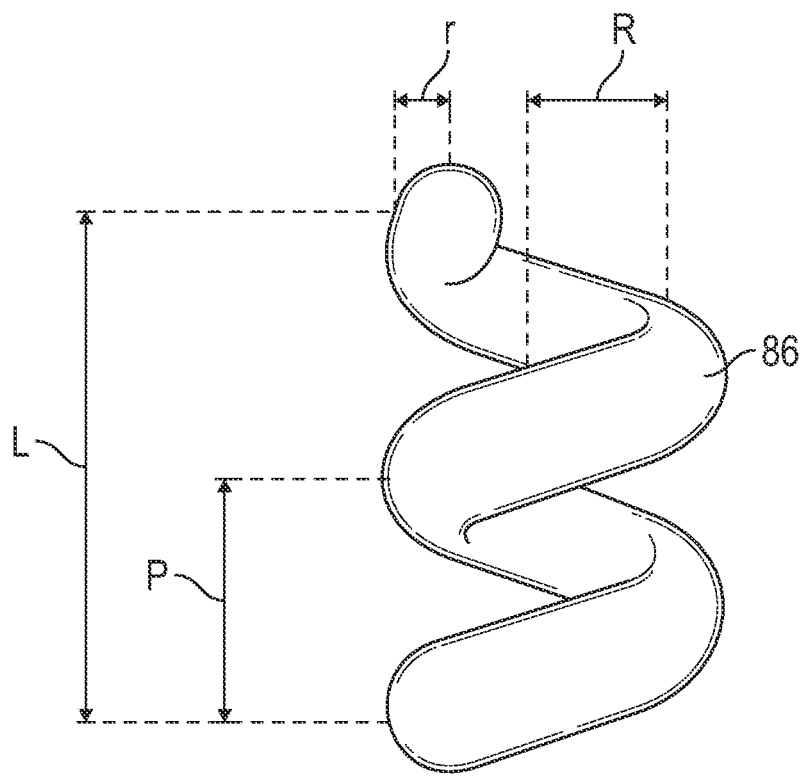
FIG. 13 is a side view of an implementation of a helical layer/pillar.

FIG. 13 is a side view of an implementation of a helix structure 86 illustrating the various physical parameters that can be used to characterize the helical structure. These include radius of the wire r, the radius of the helix R, the length of the wire L, and the pitch P measured between each segment of the helix that completes a full 360 degree rotation. The time of the deposition, speed of rotation of the wafer holder, the azimuthal angle, and the angle α can all be used to adjust these parameters during formation of the helical structures/layers in various implementations of flexible memory devices disclosed herein.

Figure 16:
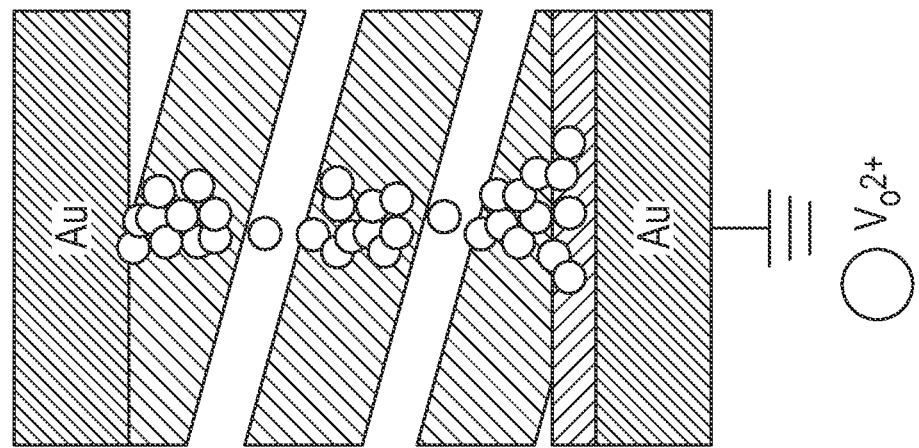
FIG. 16 is a diagram of the RRAM of FIG. 14 during refresh reset operation.
Figure 15:
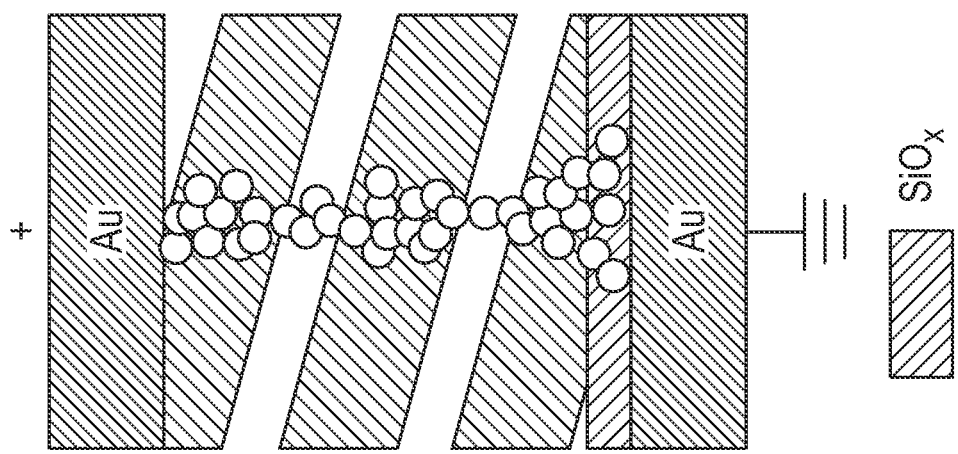
FIG. 15 is a diagram of the RRAM of FIG. 14 during a cycling stress operation.
Figure 14:
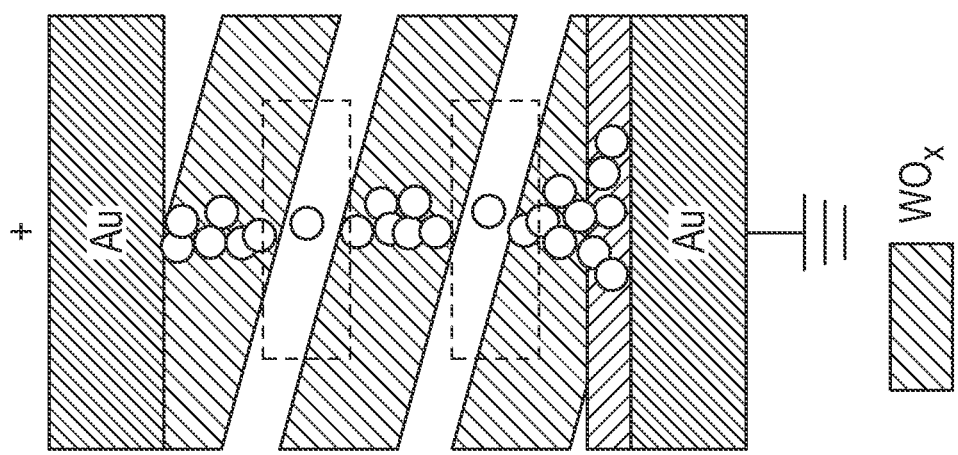
FIG. 14 is a diagram of a resistive random access memory (RRAM) during a volatile switching operation.

A flexible memory device was formed by depositing 100 nm of gold as a bottom electrode using a physical vapor deposition (PVD) process followed by growth of tungsten oxide ($WO_x$) to form a helical layer using the GLAD process previously described followed by deposition of 5 nm of silicon dioxide using atomic layer deposition (ALD) to isolate the helical layer from the gold top electrode. The gold top electrode was deposited using electron beam PVD with shadow masking used to ensure the top electrodes only formed on the tops of the helices. A diagram of a cross sectional side view of the resulting RRAM is illustrated in FIGS. 14-16. Flexible memory devices with total helix lengths/wire lengths of 50 nm, 100 nm, and 200 nm were formed. These devices were then subjected to various characterization tests.

FIGS. 14-16 show a proposed process to explain the volatile switching, cycling stressing, and RESET behaviors observed with the tungsten oxide RRAM formed. FIG. 14 shows a filamentary structure formed by oxygen vacancies being drawn from the silicon dioxide layer attached to the top gold electrode (here the top electrode is oriented at the bottom in FIGS. 14-16). During operation in FIG. 14, the filamentary structure permits volatile switching operations of the RRAM. The areas indicated in dotted boxes show the presence of gaps in the filamentary structure of FIG. 14. During cycling stressing operations, as illustrated in FIG. 15, the filamentary structure becomes continuous/connected from the top electrode to the bottom electrode. Upon application of a RESET cycle voltage/refresh reset operation, the filamentary structure ruptures as illustrated in FIG. 16 and the RRAM is then reset to engage in volatile switching again.

Figure 17:
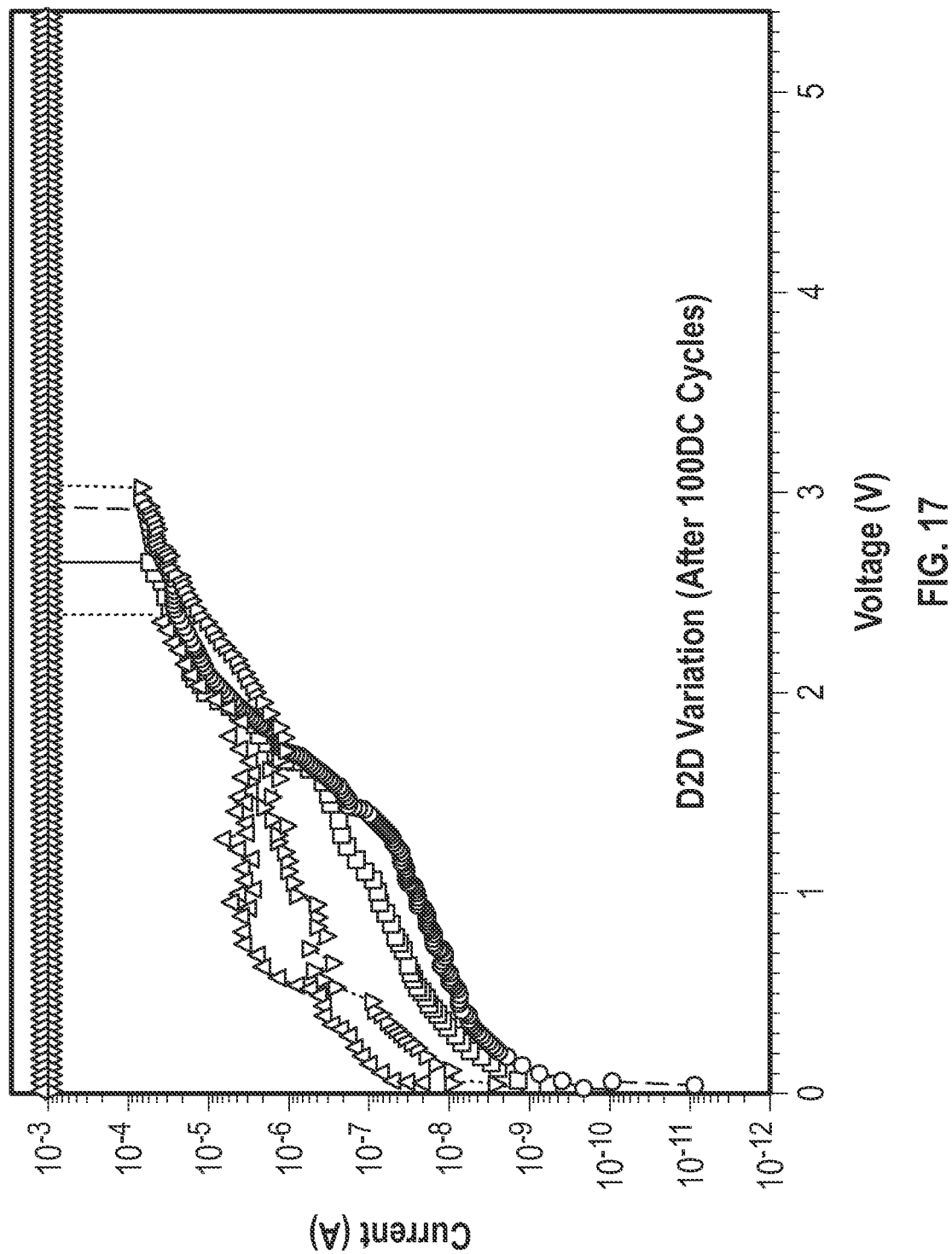
FIG. 17 is a graph of the one-time non-volatile switching after 100 direct current (DC) cycling of four helical tungsten oxide (h-WO$_x$) RRAM at a SET compliance current limit (CCL) of 1 mA.
Figure 18:
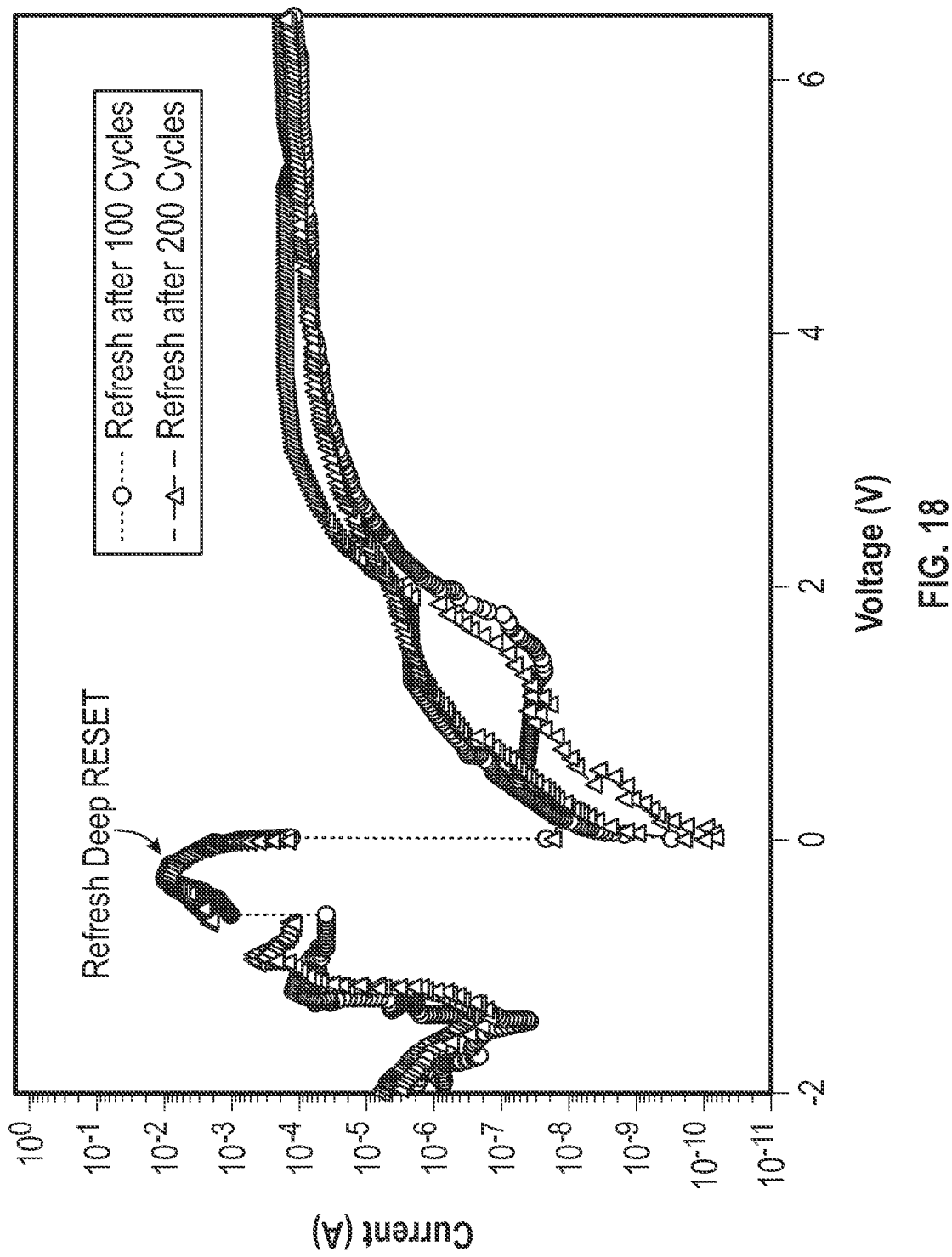
FIG. 18 is a graph of the one-time refresh pseudo-reset process for the RRAM of FIG. 17.
Figure 19:
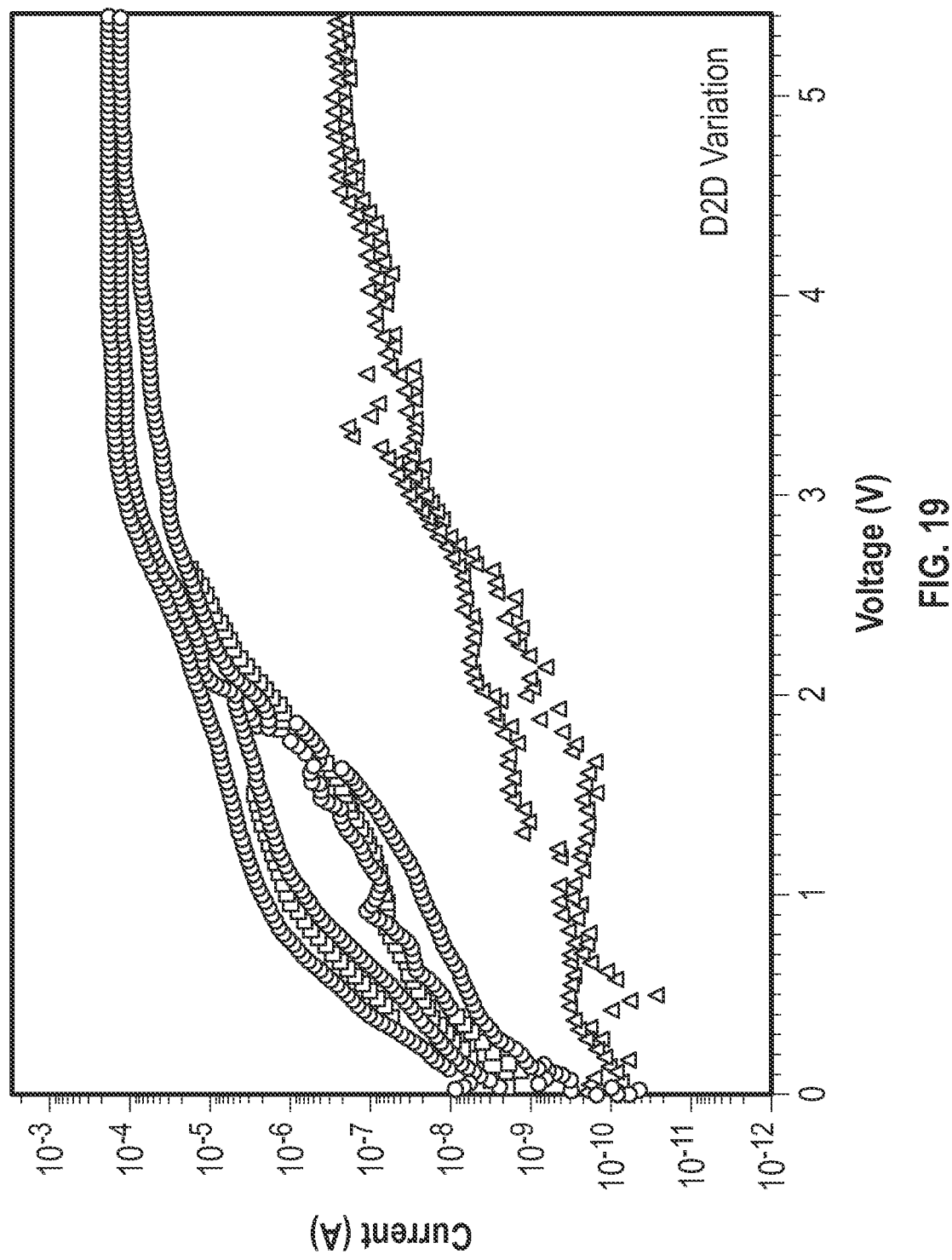
FIG. 19 is a graph of the reconfigured volatile switching of the RRAM of FIG. 17 following the pseudo-reset process of FIG. 18.
Figure 20:
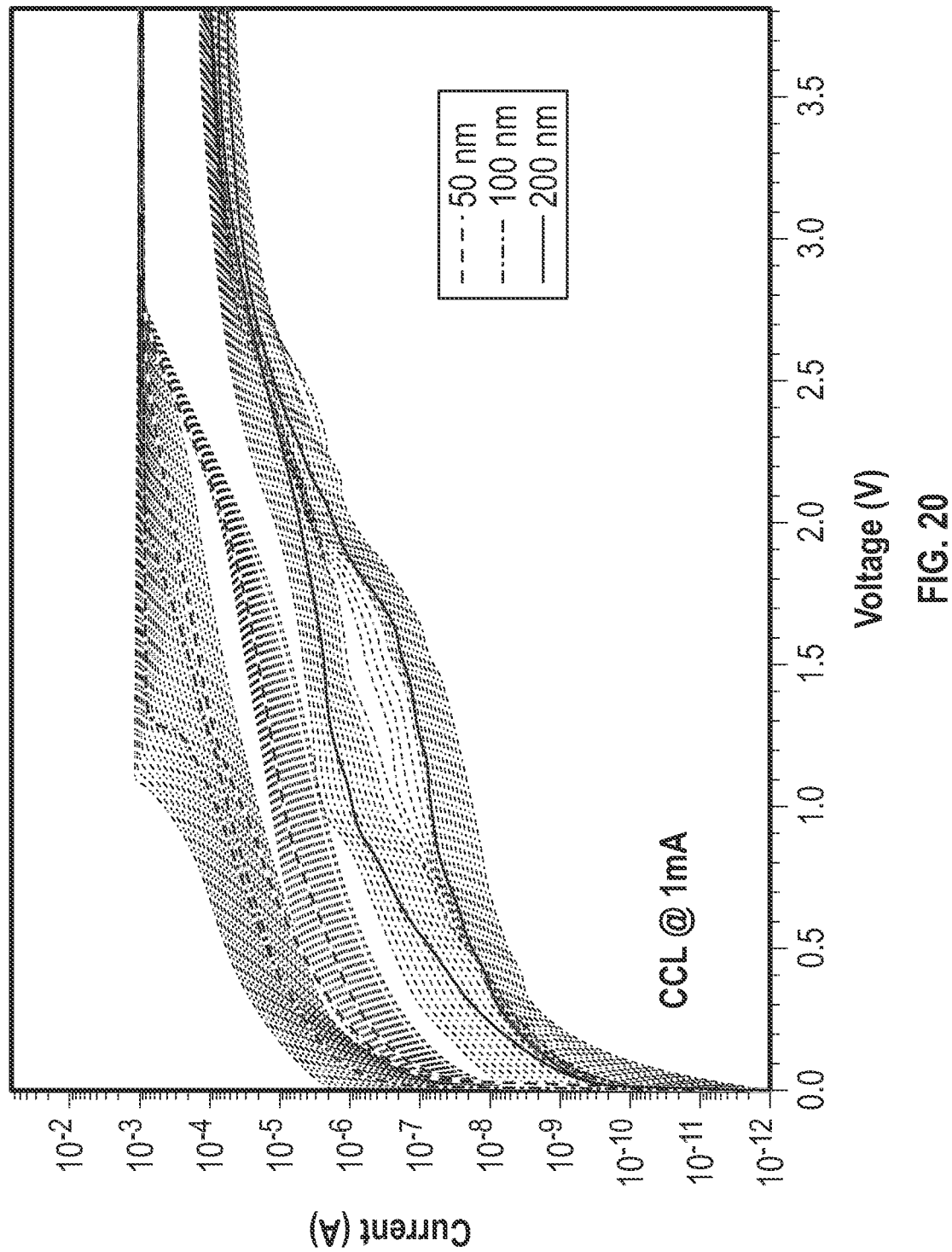
FIG. 20 is a graph of the current-voltage (I-V) characteristics of h-WO$_x$ RRAM with helical layer lengths of 50 nanometers (nm), 100 nm, and 200 nm.

FIGS. 17-21 are various graphs of operating characteristics studied using tungsten oxide RRAM/flexible memory formed using the aforementioned process. FIG. 17 is a graph of the one-time non-volatile switching after 100 direct current (DC) cycling of four helical tungsten oxide (h-WO$_x$) RRAM at a SET compliance current limit (CCL) of 1 mA. FIG. 18 is a graph of the one-time refresh pseudo-reset process for the RRAM of FIG. 17. FIG. 19 is a graph of the reconfigured volatile switching of the RRAM of FIG. 17 following the pseudo-reset process of FIG. 18. FIG. 20 is a graph of the current-voltage (I-V) characteristics of h-WO$_x$ RRAM with helical layer lengths of 50 nanometers (nm), 100 nm, and 200. FIG. 17 illustrates the device-to-device (D2D) variation for the 200 nm helical length devices where, for all four devices tested, the volatile switching of the RRAM takes place at a voltage of about 3 V before the SET current is reached and the RRAM is set in a condition where it cannot be further switched (a 1 or 0 has now been stored). FIG. 18 illustrates how, for the four 200 nm helical length tungsten oxide flexible memory devices, the devices demonstrate similar electrical performance following performing a pseudo-RESET process at 100 switching cycles followed by a deep refresh RESET process after 200. FIG. 18 indicates that deep refresh RESET is not necessarily needed to reset the RRAM and that a pseudo-RESET process is sufficient to carry out a reset during operation, thus reducing the amount of energy needed to operate the RRAM. The graph of FIG. 19 for the same tungsten oxide RRAM devices illustrates the device-to-device variation following performance of pseudo-RESET showing the RRAM is substantially reconfigured for volatile switching operation once again. The behavior of FIGS. 17-19 demonstrates that the RRAM devices that contain the tungsten oxide helical layers can be reset using a low-power process, are recoverable, and reconfigurable along with the mechanical flexibility provided by the helical structure.

Figure 21:
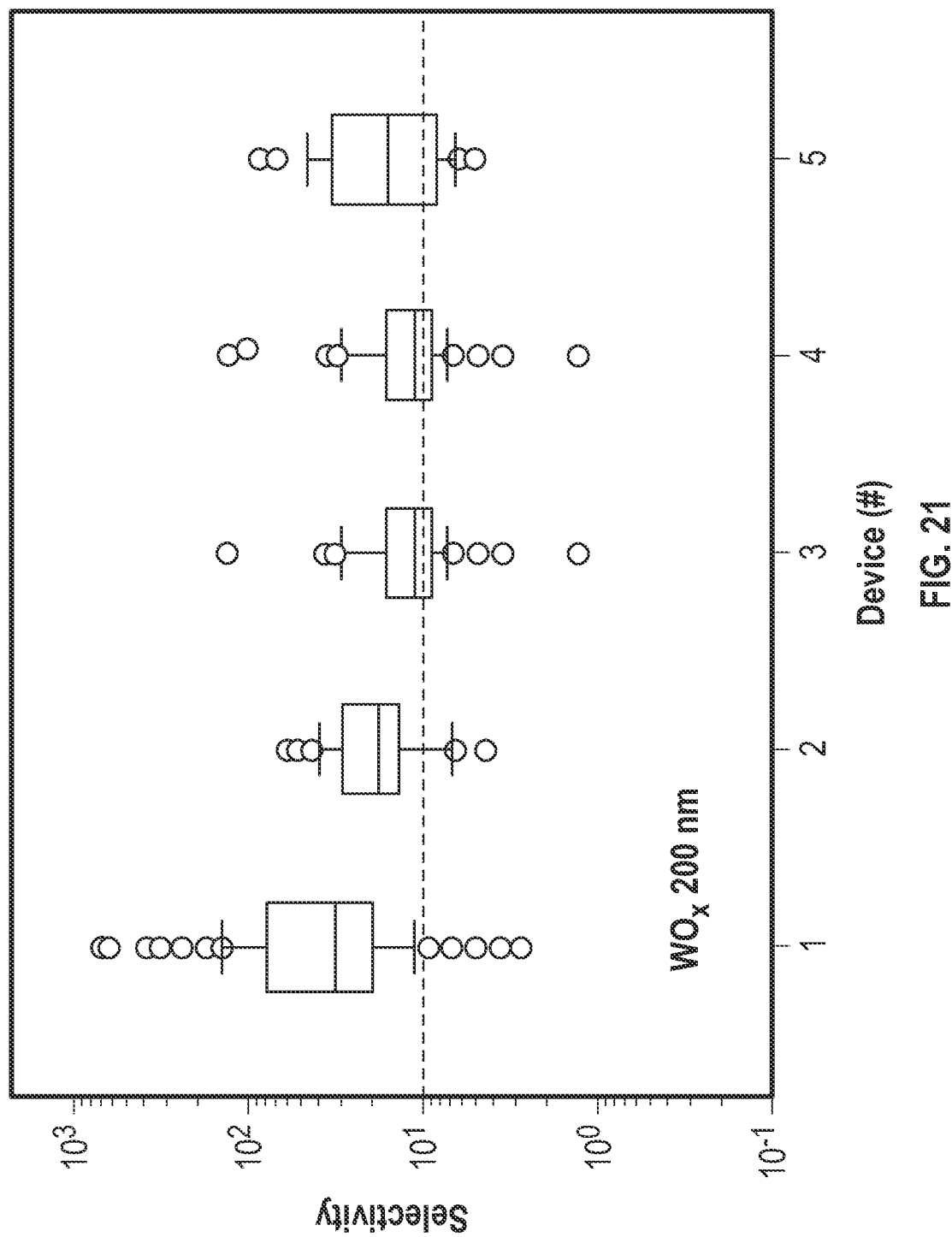
FIG. 21 is a box plot of the selectivity of five h-WO$_x$ RRAM that each have a helical layer length of 200 nm.

FIG. 20 is a graph of the current-voltage (I-V) characteristics of h-WO$_x$ RRAM with helical layer lengths of 50 nm, 100 nm, and 200 nm. As the 50 nm and 100 nm devices reached the compliance current limit before the applied voltage reached 3 V, the use of selectors/external current clamping circuits would be needed for these RRAM to prevent sneak path current cross talk from being an issue. The 200 nm devices, however, had sufficient self-compliance and selectivity to enable them to be read and written without the need to use a selector in a bilayer memory device like those disclosed herein that operate without selectors. Thus, it is apparent that the length of the helical layer can be used to determine whether the memory cell could be operated with a selector or in a selector-less manner. FIG. 21 shows the device-to-device selectivity variation in a box plot of the selectivity of five h-WO$_x$ RRAM that each have a helical layer length of 200 nm. Selectivity here is defined as the current at on-voltage divided by the current at off-voltage.

Figure 22:
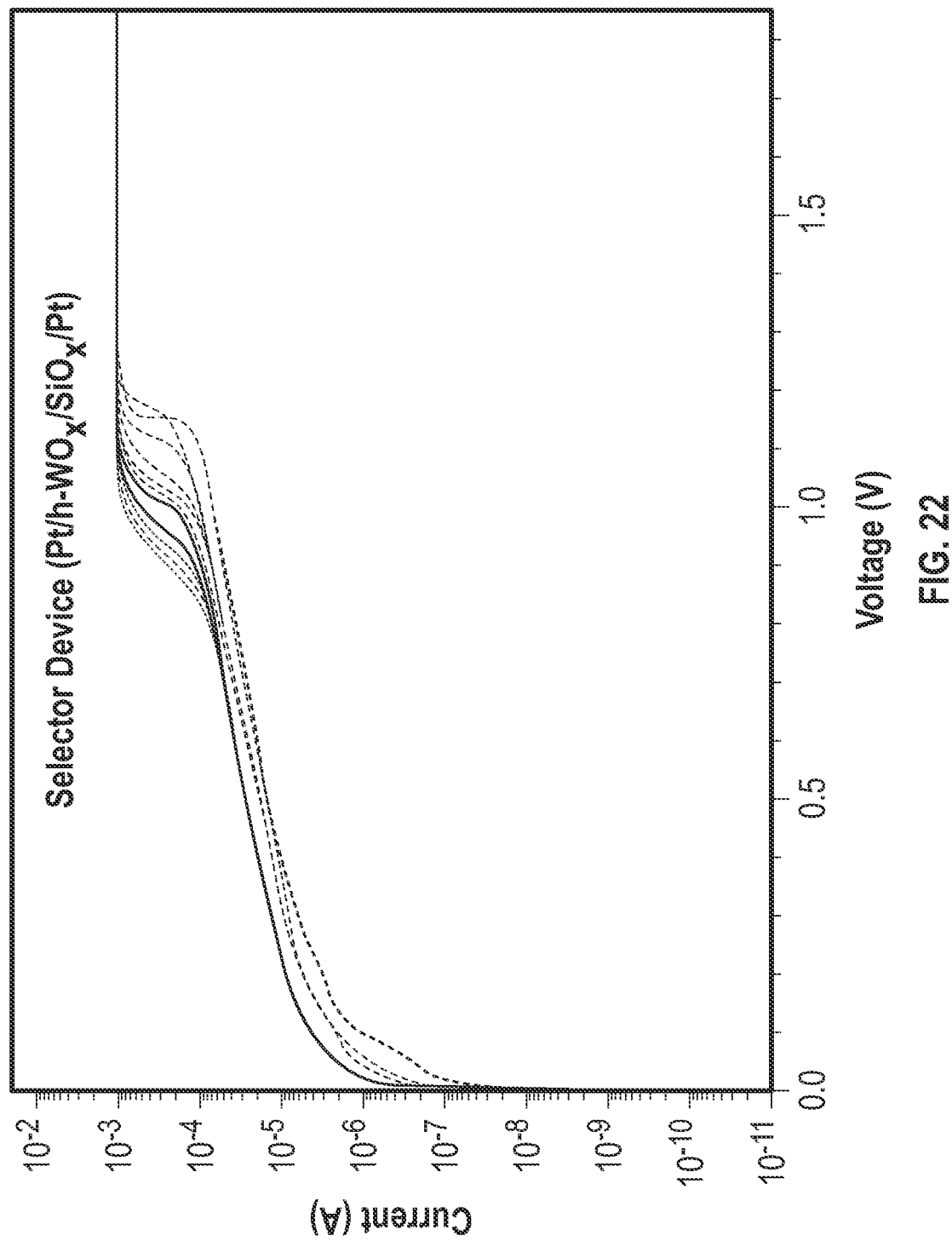
FIG. 22 is a graph of the I-V characteristics of a platinum/h-WO$_x$/SiO$_x$/platinum RRAM used as a selector device.
Figure 24:
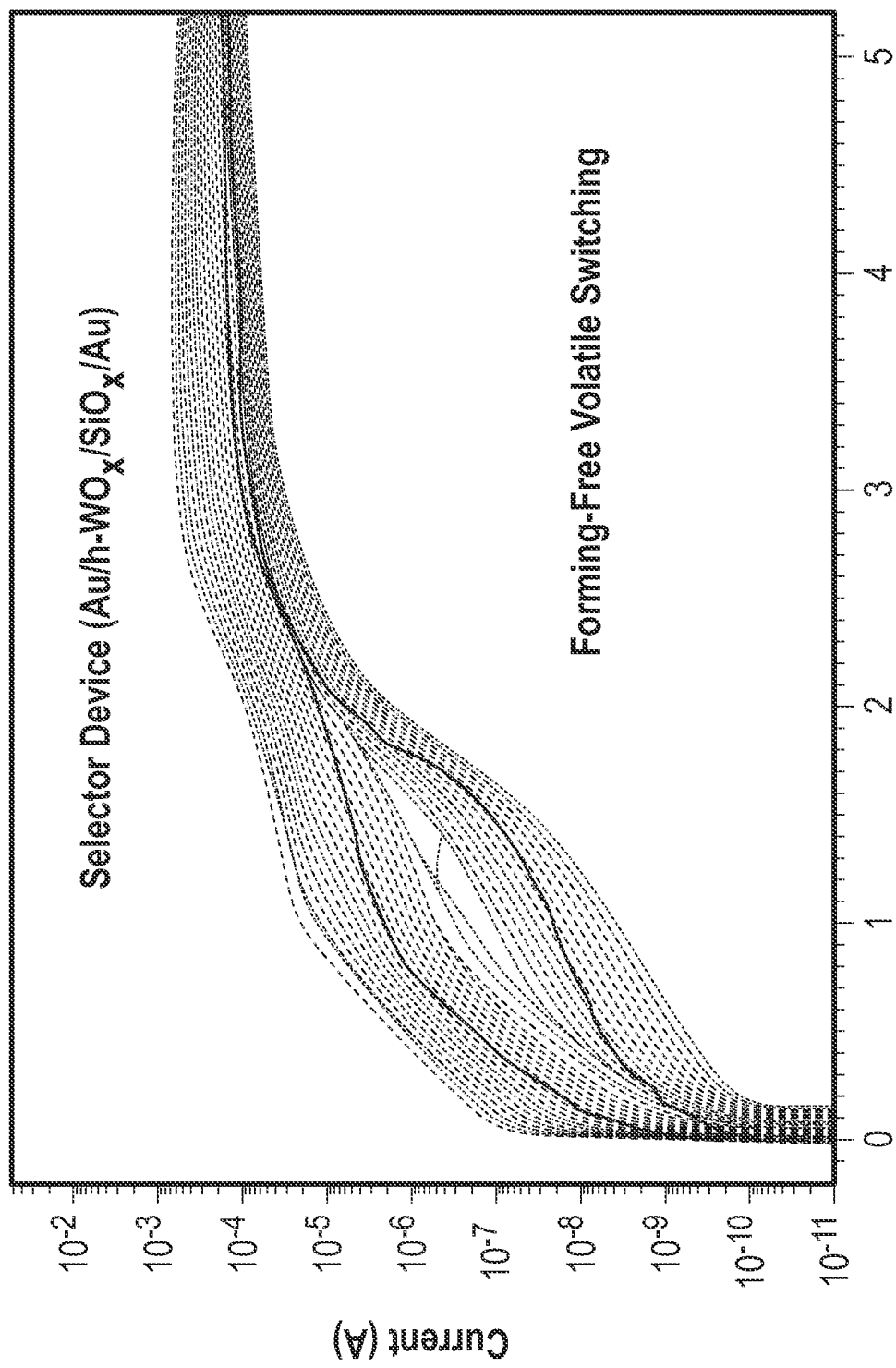
FIG. 24 is a graph of the I-V characteristics of a gold/h-WO$_x$/SiO$_x$/gold RRAM used as a selector device.

FIG. 22 is a graph of the I-V characteristics of a platinum/h-WO$_x$/SiO$_x$/platinum RRAM used as a selector device where the tungsten oxide helix wire length was 200 nm. The results in FIG. 22 contrast with the I-V characteristics for the 200 nm helix length tungsten oxide devices graphed in FIG. 20 and FIG. 24, showing a higher off current for devices that used platinum as electrodes than for gold. This is believed to correspond with lower metal work function of platinum (about 4.6 eV) versus that of gold (about 5.3 eV). This higher off current lowers the selectivity of the memory devices, which can be compensated for by increasing the length of the tungsten oxide helices accordingly as indicated in the graph of selectivity in FIG. 27.

Figure 23:
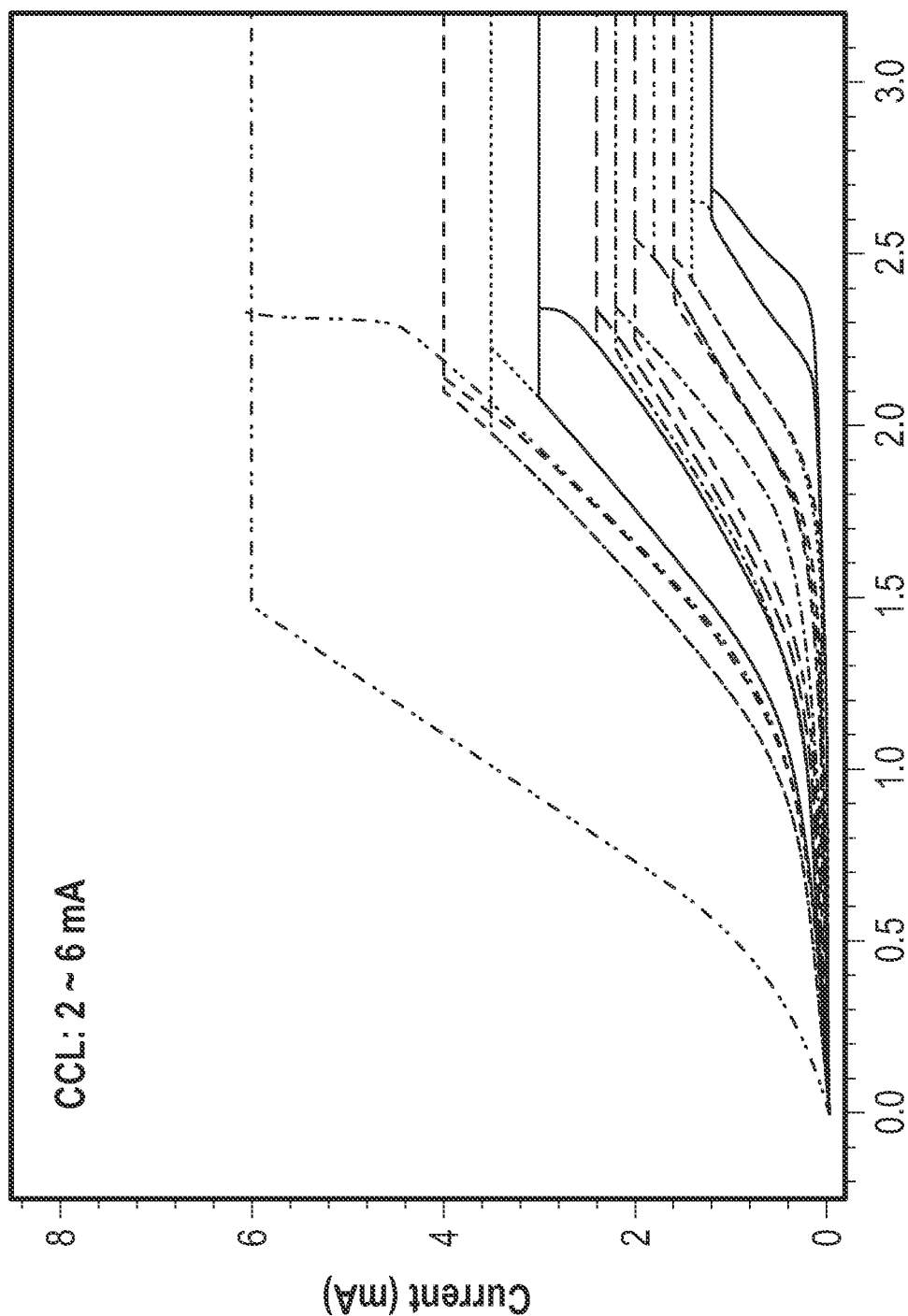
FIG. 23 a graph of the selector behavior with CCL modulation.
Figure 25:
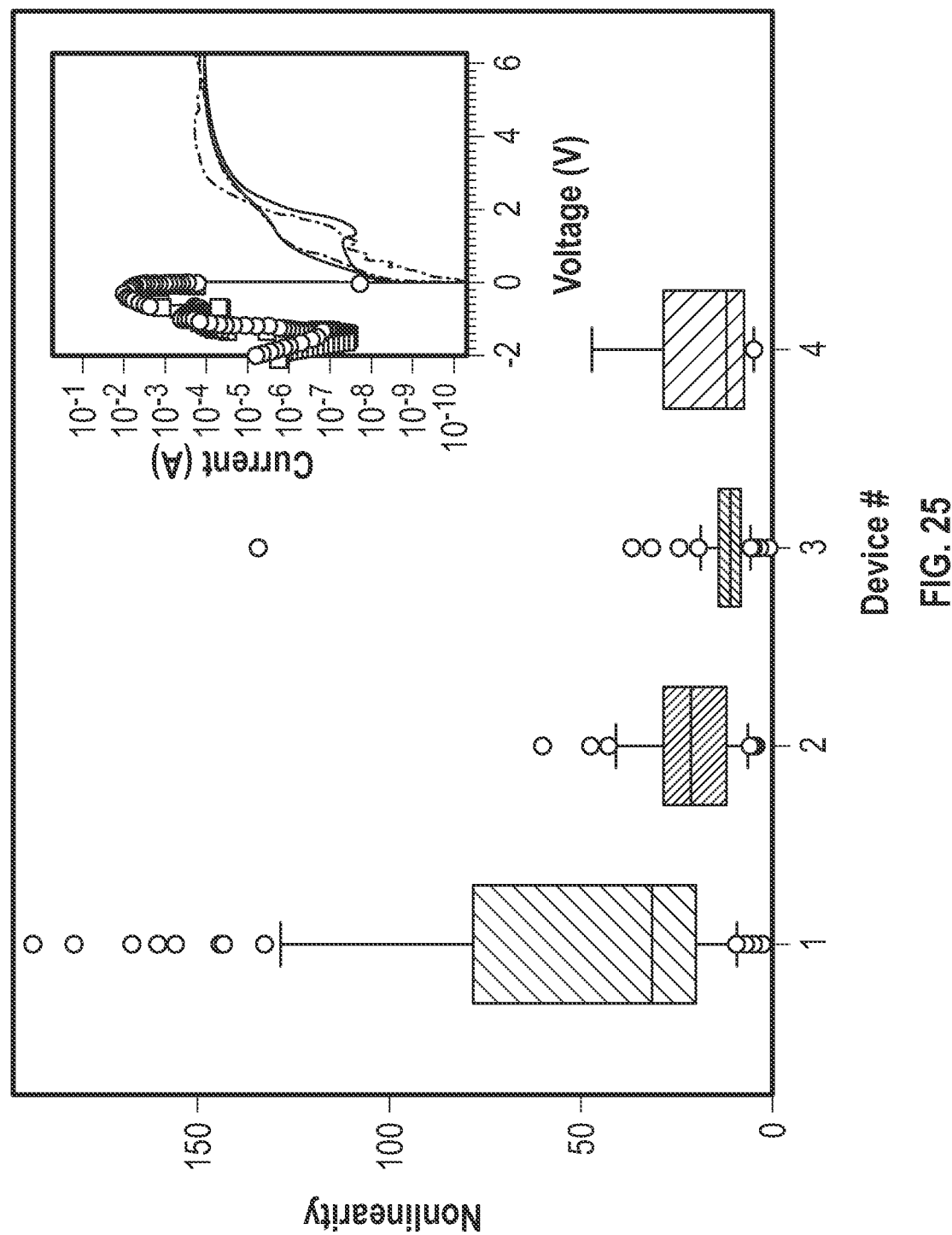
FIG. 25 is a box plot of the selectivities of four different helical RRAMs with the cycle-to-cycle distribution.

FIG. 23 is a graph of the selector behavior with CCL modulation from 2 to 6 mA for the platinum RRAM devices indicating that the volatile switching behavior changes to nonvolatile switching behavior at a CCL level of 6 mA. FIG. 25 is a box plot of the selectivities of four different helical RRAMs with the cycle-to-cycle distribution. The inset graph in FIG. 25 shows the I-V behavior of the devices during a RESET process to reset the devices back to a volatile switching process like that previously described. The behavior of the tungsten oxide devices using platinum electrodes indicates that, for a sufficiently long tungsten oxide helix wire length, the selectivity of the resulting RRAM can be sufficient to create a self-rectifying device that can be used in a flexible bilayer memory device like those disclosed herein without needing the use of a selector.

Figure 26:
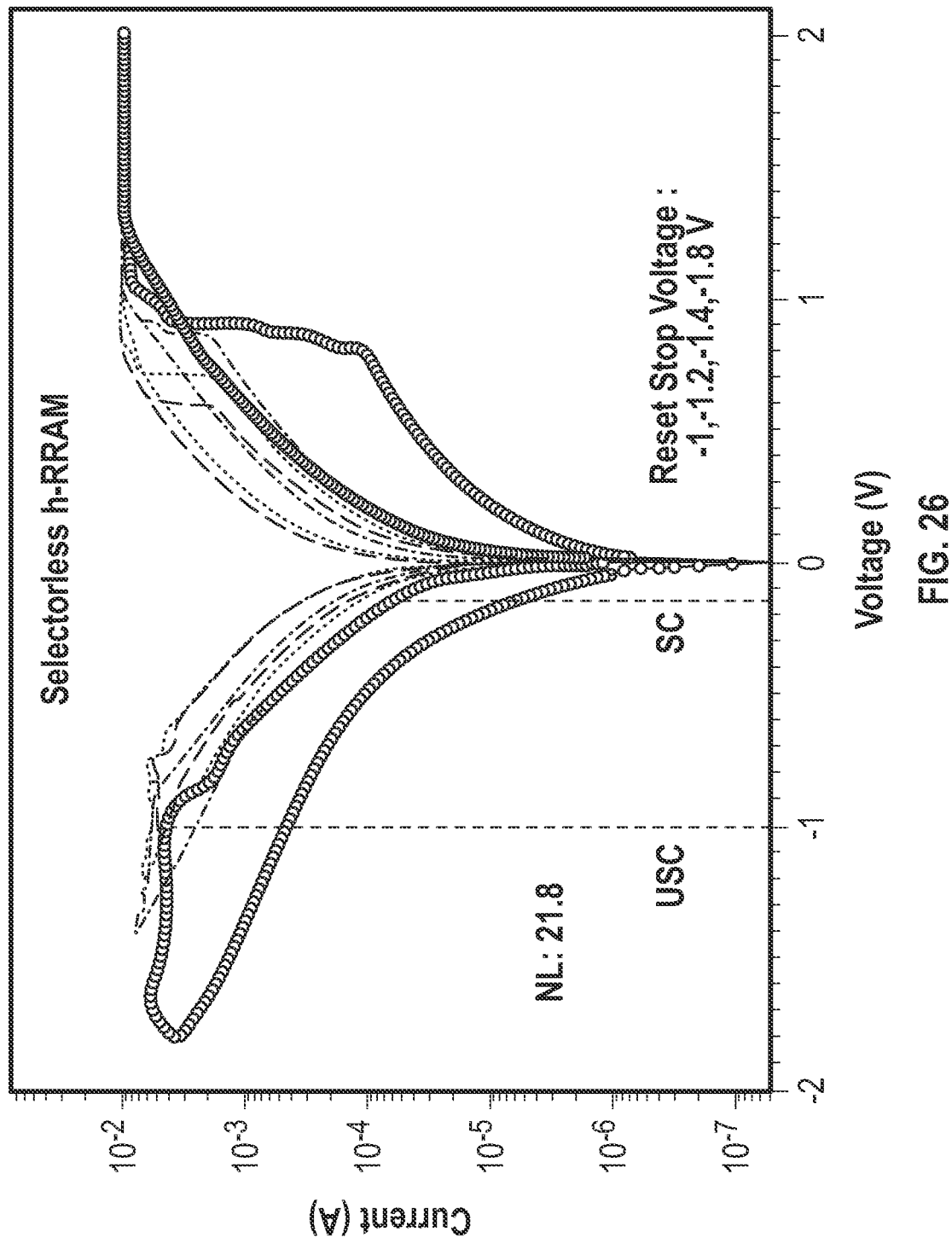
FIG. 26 is a graph of the I-V characteristics of a h-HfO$_x$/SiO$_x$ RRAM.

The foregoing discussion has involved the study of the behavior of flexible memory devices formed from high-K layers that include helices of tungsten oxide. The high-K material can also, in various implementations, include hafnium oxide formed into a helix using a similar process (see the experimental method section in Appendix A filed herewith) and at similar helix wire lengths as for the tungsten oxide devices. FIG. 26 is a graph of the I-V characteristics of a h-HfO$_x$/SiO$_x$ RRAM that has a non-linearity of 21.8 defined as the current at a read voltage divided by the current a one third the read voltage. A larger nonlinearity indicates that the device has a stronger immunity to sneak path current.

Figure 27:
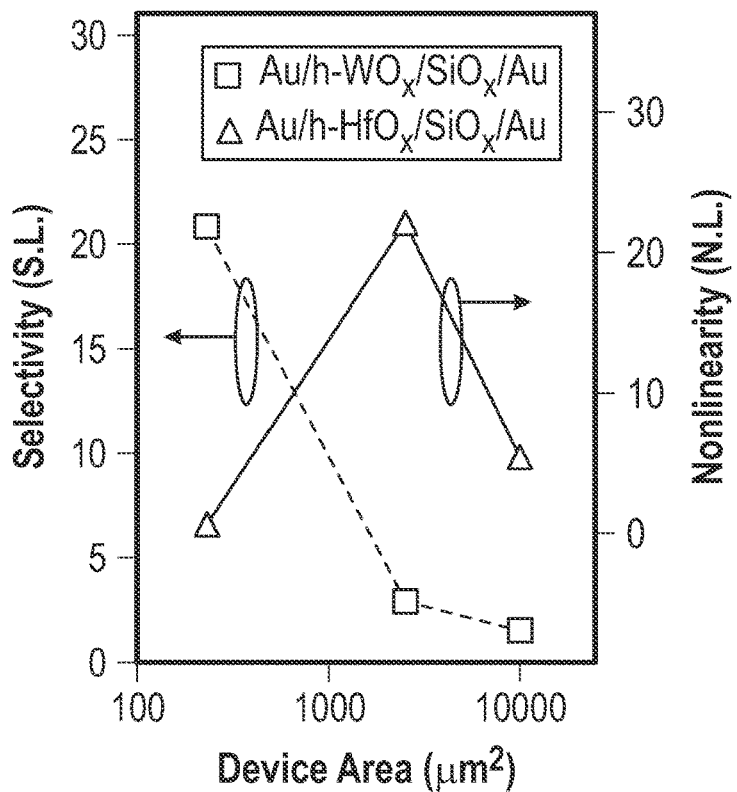
FIG. 27 is a graph of the selectivity and nonlinearity of h-HfO$_x$/SiO$_x$ RRAM and h-WO$_x$/SiO$_x$ RRAM showing device area dependence.
Figure 28:
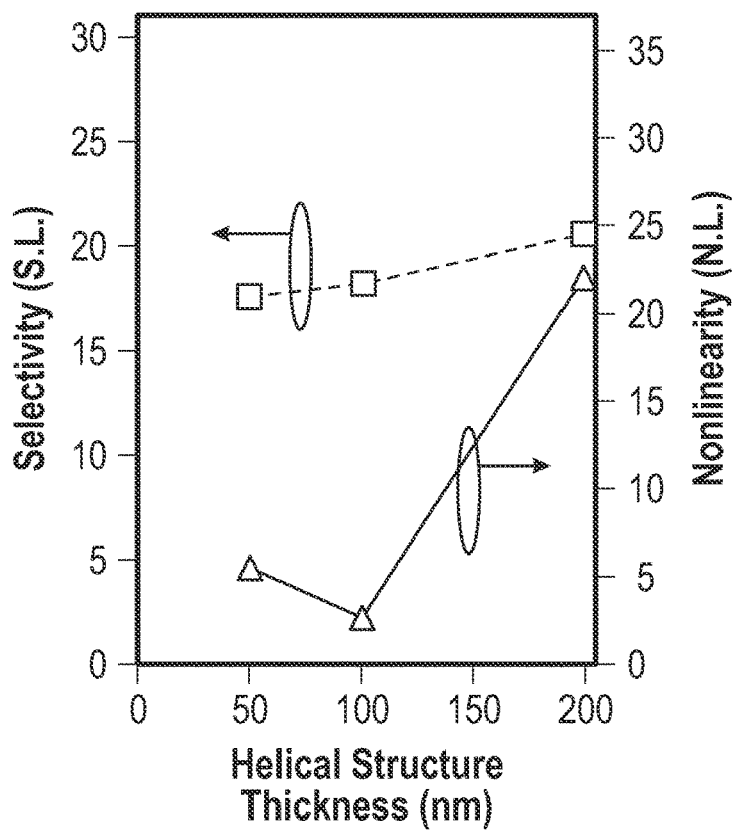
FIG. 28 is a graph of selectivity and nonlinearity of h-HfO$_x$/SiO$_x$ RRAM and h-WO$_x$/SiO$_x$ RRAM showing thickness dependence.

FIG. 27 is a graph of the selectivity and nonlinearity of h-HfO$_x$/SiO$_x$ RRAM and h-WO$_x$/SiO$_x$ RRAM showing the device area dependence of selectivity for each device type. By inspection, it appears that the selectivity of the tungsten oxide devices decreases as the device area (determined in part by the helix length) increases. For the hafnium oxide devices, however, a peak in selectivity (and nonlinearity) is noted at about 2500 square microns of device area. FIG. 28 is a graph of selectivity and nonlinearity of h-HfO$_x$/SiO$_x$ RRAM and h-WO$_x$/SiO$_x$ RRAM showing thickness/helix wire length dependence which shows that for the hafnium oxide device, the selectivity rises significantly from 100 nm to 200 nm in length to substantially match that of the tungsten oxide device of the same wire length. These results indicate that self-rectifying behavior sufficient to avoid the need for additional selectors has been observed for helix lengths of about 200 nm for both tungsten oxide and hafnium oxide. This indicates that selector-less bilayer flexible memory devices can be formed using either material using the principles disclosed herein.

Figure 29:
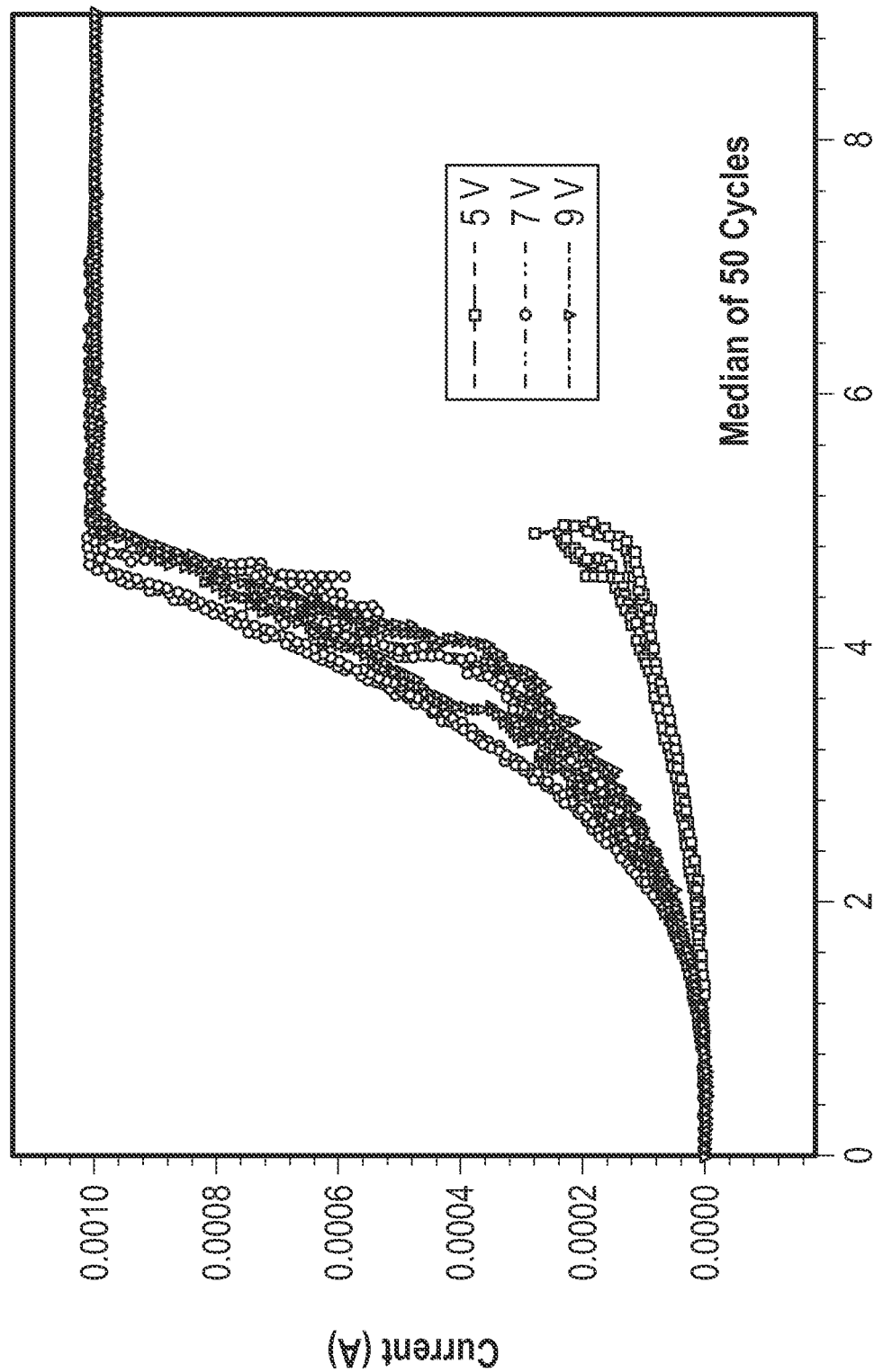
FIG. 29 is a graph of the median of 50 DC cycles on a hafnium oxide RRAM with helical layers at three applied voltage biases.
Figure 30:
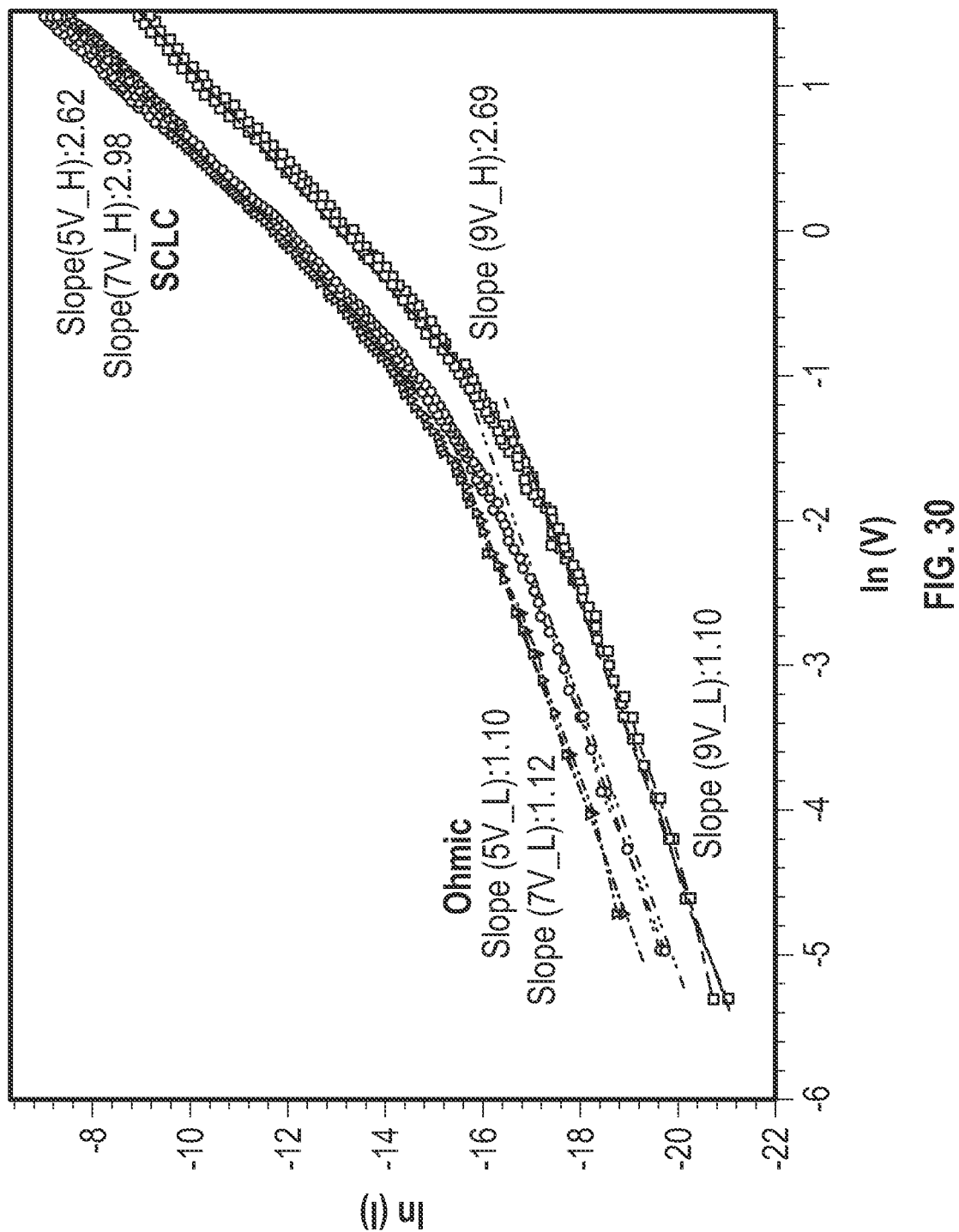
FIG. 30 is a graph of a numerical current fit of the natural log of current versus the natural log of voltage for implementations of a hafnium oxide RRAM with helical layers.

FIG. 29 is a graph of the median of 50 DC cycles on a hafnium oxide RRAM with helical layers at three applied voltage biases that shows the rectifying behavior of the device. The stop voltages are 5 V, 7 V, and 9 V with a SET CCL of 1 mA indicating the self-rectifying behavior is observed at these various applied biases. FIG. 30 is a graph of a numerical current fit of the natural log of current versus the natural log of voltage for implementations of a hafnium oxide RRAM with helical layers. This graph and the $R^2$ values of greater than 0.99 indicate that there is no bias dependence on the current transport models for this helical device.

The various RRAM implementations disclosed herein may be used in various implementations of a method of forming a flexible memory system. In the various method implementations, the method includes forming a film of RRAM cells on a polymer transfer layer where the RRAM cells are like any disclosed in this document. The method also includes transferring the film of RRAM cells to a thermal release tape. The method then includes patterning the film of RRAM cells. In various method implementations, the patterning takes place by cutting the thermal release tape.

The cutting may take place in various ways including, by non-limiting example, mechanical cutting, laser cutting, etching, or any other method of cutting a film or tape. The resulting pattern may take any of a wide variety of closed shapes, including, by non-limiting example, serpentine shapes, rectangular shapes, elliptical shapes, circular shapes, or any other closed shape. The method also includes transferring the patterned film of RRAM cells to a flexible substrate. In various implementations, the flexible substrate may be made of a biocompatible material.

The RRAM cells formed on the polymer transfer layer may be any disclosed in this document. The RRAM cells may include a selector in some implementations and in others may be self-rectified. Each RRAM cell may include only two terminals. In various implementations, the application and removal of a sacrificial polymer layer like a poly(methyl-methacrylate) (PMMA) or polyimide during the process may be used to support the RRAM cell helices during the patterning and transfer operations. In such implementations, the sacrificial polymer layer may be applied after formation of the RRAM cells and prior to patterning or after patterning and before transfer.

In places where the description above refers to particular implementations of flexible memory system and implementing components, sub-components, methods and sub-methods, it should be readily apparent that a number of modifications may be made without departing from the spirit thereof and that these implementations, implementing components, sub-components, methods and sub-methods may be applied to other flexible memory systems.

What is claimed is:

1. A resistive random access memory comprising:
   a bottom electrode;
   a helical layer of hafnium oxide coupled to the bottom electrode;
   an isolation layer coupled to the helical layer; and
   a top electrode coupled to the isolation layer.

2. The memory of claim 1, wherein the bottom electrode and the top electrode are each one of gold or platinum.

3. The memory of claim 1, wherein the isolation layer is silicon dioxide.

4. The memory of claim 1, wherein a length of the helical layer is between 50 nanometers and 200 nanometers.

5. The memory of claim 1, wherein a thickness of the isolation layer is 5 nanometers.

6. The memory of claim 1, wherein a length of the helical layer is between 60% to 80% of a total length of the memory.

7. The memory of claim 1, wherein the memory is self-rectified.

8. A resistive random access memory comprising:
   a bottom electrode;
   a helical layer of tungsten oxide coupled to the bottom electrode;
   an isolation layer coupled to the helical layer; and
   a top electrode coupled to the isolation layer.

9. The memory of claim 8, wherein the bottom electrode and the top electrode are each one of gold or platinum.

10. The memory of claim 8, wherein the isolation layer is silicon dioxide.

11. The memory of claim 8, wherein a length of the helical layer is between 50 nanometers and 200 nanometers.

12. The memory of claim 8, wherein a thickness of the isolation layer is 5 nanometers.

13. The memory of claim 8, wherein a selectivity of volatile switching of the memory is recoverable and reconfigurable during operation.

14. The memory of claim 8, wherein the memory is self-rectified.

15. A method of forming a flexible memory system, the method comprising:
    forming a film of resistive random access memory cells on a polymer transfer layer, each resistive random access memory cell comprising:
       a bottom electrode;
       a helical layer of one of hafnium oxide or tungsten oxide coupled to the bottom electrode;
       an isolation layer coupled to the helical layer; and
       a top electrode coupled to the isolation layer;
    transferring the film of resistive random access memory cells to a thermal release tape;
    patterning the film of resistive random access memory cells; and
    transferring the patterned film of resistive random access memory cells to a flexible substrate.

16. The method of claim 15, wherein each cell of the film of resistive random access memory cells comprises a selector.

17. The method of claim 15, wherein each cell of the film of resistive random access memory cells is self-rectified.

18. The method of claim 15, wherein the flexible substrate is a biocompatible material.

19. The method of claim 15, wherein each cell of the film of resistive random access memory cells comprises only two terminals.

20. The method of claim 15, wherein one of patterning the film of resistive random access memory cells or transferring patterned film further comprises applying a sacrificial polymer layer.

* * * * *